(12) United States Patent
Anders

(10) Patent No.: US 9,321,409 B2
(45) Date of Patent: Apr. 26, 2016

(54) INSTALLATION FRAME FOR ACCOMMODATING A DEVICE IN AN INSTALLATION OPENING

(75) Inventor: Bernward Anders, Hildesheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 1234 days.

(21) Appl. No.: 13/255,600

(22) PCT Filed: Mar. 11, 2010

(86) PCT No.: PCT/EP2010/053070
§ 371 (c)(1),
(2), (4) Date: Nov. 11, 2011

(87) PCT Pub. No.: WO2010/103059
PCT Pub. Date: Sep. 16, 2010

(65) Prior Publication Data
US 2012/0079694 A1    Apr. 5, 2012

(30) Foreign Application Priority Data
Mar. 11, 2009  (DE) .......................... 10 2009 001 457

(51) Int. Cl.
| H05K 9/00 | (2006.01) |
| G06F 1/18 | (2006.01) |
| B60R 11/02 | (2006.01) |
| B60R 11/00 | (2006.01) |

(52) U.S. Cl.
CPC .......... *B60R 11/0211* (2013.01); *H05K 9/0016* (2013.01); *B60R 2011/0075* (2013.01); *B60R 2011/0078* (2013.01); *G06F 1/184* (2013.01); *Y10T 29/53961* (2015.01)

(58) Field of Classification Search
CPC ............... H05K 9/0067; H05K 9/0016; H01R 23/6873; H01R 13/65802; G06F 1/087; G06F 1/184; G06F 1/181

USPC ............ 29/281.1, 700, 281.5, 281.6; 269/47, 269/55, 48, 4, 16, 287; 220/324; 361/679.35, 726
See application file for complete search history.

(56) References Cited

U.S. PATENT DOCUMENTS

| 4,868,975 A * | 9/1989 | Zaremba et al. ................. 29/741 |
| 5,797,770 A * | 8/1998 | Davis et al. .............. 439/607.27 |
| 5,928,035 A * | 7/1999 | Jankowsky et al. ....... 439/607.36 |

FOREIGN PATENT DOCUMENTS

| DE | 79 33 920 | 3/1980 |
| DE | 29 03 176 | 7/1980 |
| DE | 102007004021 | 7/2008 |

*Primary Examiner* — Lee D Wilson
*Assistant Examiner* — Seahee Yoon
(74) *Attorney, Agent, or Firm* — Kenyon & Kenyon LLP

(57) ABSTRACT

An installation frame for accommodating a device in a predefined installation opening is described. The installation frame has wall sections which enclose a largely cuboid cavity which is open at least on the front for accommodating the device, front edges of at least a portion of the wall sections forming flange-like outwardly projecting edge sections for resting against a front edge of the installation opening. The installation frame also has a latching arrangement which project to the outside from at least a portion of the wall sections and engage with the back of the installation opening, wherein the latching means have at least approximately arc-shaped sections which extend into the cavity and furthermore have an end section which projects to the outside through the wall sections for engaging with the installation opening in such a way that the arc-shaped sections are flattened when the device is inserted into the cavity and consequently are elongated in the direction of the back of the installation opening so that the installation opening is clamped between the front edge sections and the latching means of the installation frame. The installation frame may be easily, quickly and securely attached within the installation opening.

13 Claims, 4 Drawing Sheets

INSTALLATION FRAME FOR ACCOMMODATING A DEVICE IN AN INSTALLATION OPENING

FIELD OF THE INVENTION

The present invention is directed to an installation frame.

BACKGROUND INFORMATION

An installation system for installing an auxiliary device in a predefined installation opening, in particular a standardized installation shaft in a motor vehicle, is described in German Patent No. DE 29 03 176 C2. This installation system includes an installation frame for accommodating and attaching the auxiliary device. The installation frame has wall sections which enclose a largely cuboid cavity which is open at least on the front for accommodating the auxiliary device, front edges of at least a portion of the wall sections forming flange-like outwardly projecting edge sections for resting against a front edge of an installation opening. Furthermore, a latching arrangement, which projects to the outside after being deformed from the wall sections and which engages with the back of the installation opening, is molded onto the wall sections. The installation frame is thus clamped onto and attached to the installation opening by the front edge sections and the latching arrangement on the back of the installation opening.

The auxiliary device may then be attached within an installation shaft of this type with the aid of different means, in the case of German Patent No. DE 29 03 176 C2 with the aid of outwardly projecting catch springs which are situated on the housing of the auxiliary device and which penetrate openings in the installation frame and engage with their edges when the device is inserted into the installation frame.

An installation frame of this type is ordinarily used to install a car radio or a vehicle navigation system or a similar auxiliary device in a cutout provided for this purpose in an instrument panel of a vehicle. This cutout, which is also referred to as an installation shaft or, in the case herein, generally as an installation opening, is described in DIN/ISO 7736. This standard refers to the single DIN installation space, which has the dimensions 182 mm×53 mm. Moreover, other installation shafts exist which vary, in particular, in height, including, for example, the so-called double DIN installation shaft, which is 112 mm in height.

The conventional frames, for example described in German Patent No. DE 29 03 176 C2, are connected in a form-locked manner to the instrument panel, hereinafter also referred to as the dashboard, by bending prestamped latching tabs. In this attachment method, the fact that a secure connection is not provided in the event of an impact from the rear has turned out to be disadvantageous. The effectiveness of the conventional systems depends on how well or how poorly prestamped latching tabs are bent and on how many latching tabs are bent. The stability of the device installation also depends on how conscientiously this work is carried out. The installation is furthermore time-consuming, due to the necessary bending of the latching tabs or latching means. This, in turn, presents an obstacle to assembly during vehicle manufacture on an assembly line.

SUMMARY

An object of the present invention is therefore to provide an installation frame which eliminates the aforementioned disadvantages of the known approaches.

Example embodiments of the present invention may have the advantage that an installation frame for accommodating a device may be easily and securely attached within the installation opening. The approach described herein makes do with little assembly complexity. Compared to previous approaches, an example installation frame according to the present invention may be installed without much specialized knowledge or specialized skill and within a short period of time, and it is thus suitable, in particular, for assembly line production in an automobile manufacturing plant. Compared to previous approaches, the attachment of the installation frame is more stable; in particular, it is insensitive to mechanical shocks such as hits or impact. In particular, the stability of the installation is also largely independent of the quality of the fitter's work.

The operating principle underlying the present invention is based on the length ratio between the radian measure and the chord of an arc. Crescent-shaped or arc-shaped spring arms, which extend into the accommodating opening of the installation shaft and which lie opposite each other, are, loaded upon insertion of an auxiliary device, such as a car radio, a navigation device or the like, in such a way that the radius of the arc is enlarged and, as a result, the chord of the arc lengthens. The elongation of the chord of the arc results in a form-locked and force-fit connection between the holding frame and the dashboard.

BRIEF DESCRIPTION OF THE DRAWINGS

Exemplary embodiments of the present invention are illustrated in the figures and explained in greater detail below. The same reference numerals in the figures identify the same elements or elements having the same function.

DETAILED DESCRIPTION OF EXAMPLE EMBODIMENTS

Figure 1:
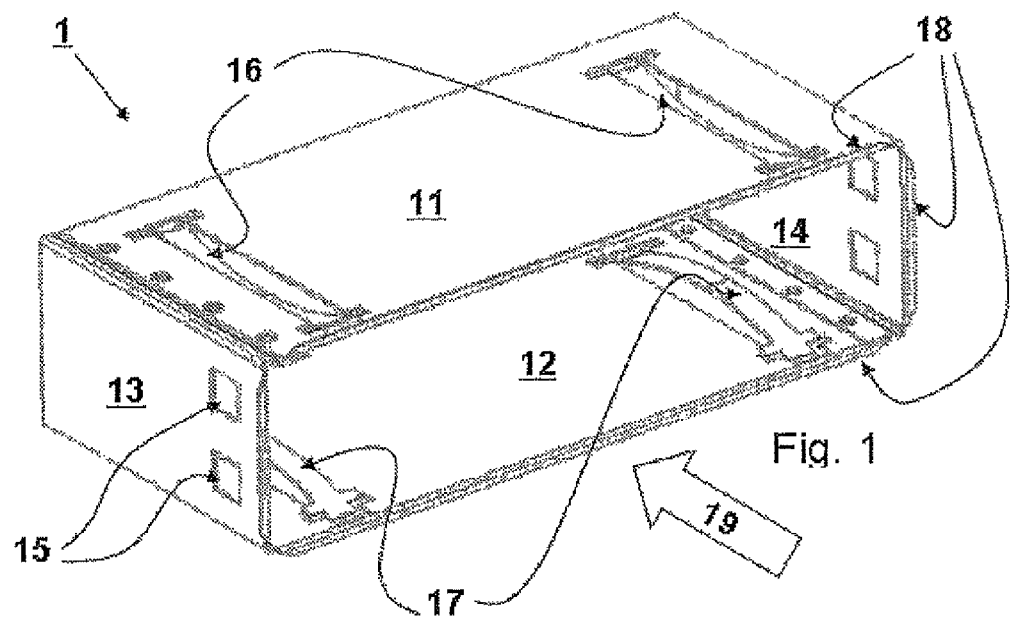
FIG. 1 shows a first variant of the installation frame according to the present invention.

FIG. 1 shows an installation frame 1 according to the present invention by way of example. This installation frame 1 has a cover 11, a base 12 as well as a left side wall 13 and a right side wall 14. Cover 11, base 12 and both side walls 13 and 14 enclose a largely cuboid space which is used to accommodate a device, for example a car radio or navigation unit 2 (see FIG. 4). To accommodate device 2, installation frame 1 has at least one opening on the front, into which device 2 may be inserted along arrow 19. Installation frame 1 is also preferably open at the back, for example to be able to easily install connecting lines for device 2.

Installation frame 1 has openings 15 in its side walls 13 and 14. These openings are used to attach device 2 in a conventional manner, for example as described in German Patent No.

DE 29 03 176 C2. For this purpose, device 2 has appropriate latching means on the side walls of its housing which engage with openings 15 in the end position of device 2 in the frame when the device is inserted into installation frame 1 along insertion direction 19 and thus hold device 2 in the frame.

Frame 1 has an edge section 18 on its front which projects beyond the outer dimensions of frame 1. If installation frame 1 is inserted into an installation shaft which matches the outer dimensions or generally into an installation opening in a wall, for example a dashboard of a vehicle, edge section 18 rests against wall 31 surrounding the installation opening on the front and thus prevents installation shaft 1 from being pushed farther in insertion direction 19.

To this extent, installation shaft 1 is described in, for example, German Patent No. DE 29 03 176 C2.

Figure 3:
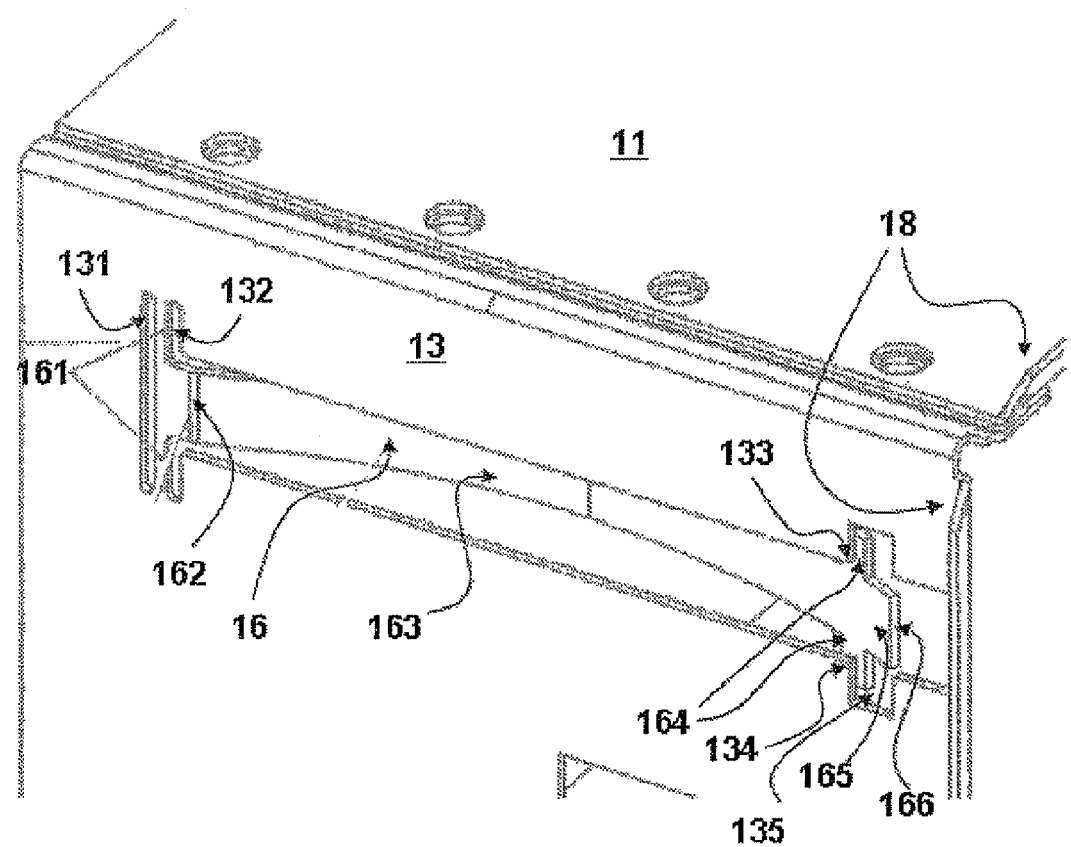
FIG. 3 shows a detailed view of the installation frame according to the present invention.

Installation shaft 1 according to the present invention now has elastic tongues 16 and 17 in walls opposite each other, for example in cover 11 and in base 12 in the present case, alternatively, for example, in both side walls 13 and 14. These elastic tongues 16 and 17 are connected to the associated wall on one side in the rear area of the installation frame; in the present case, elastic tongues 16 are connected to cover 11 and elastic tongues 17 are connected to base 12 (also see FIG. 3). Starting from this bearing point 161, elastic tongues 16 and 17, which are deformed in the shape of a crescent or an arc and are connected to bearing point 161 via a bending edge, extend in the direction of the installation opening in installation frame 1. Due to their arc shape, elastic tongues 16 and 17 first extend from their bearing point 161 (FIG. 3) ever farther into the interior of installation shaft 1 in order to then move ever closer to walls 11, 12. In the illustrated specific embodiment, arc-shaped area 163 of the elastic tongues extends from bearing point 161 largely to the free end thereof.

Alternatively, the arc-shaped area could also be limited to a subarea of the elastic tongues. In addition, the arc-shaped area does not have to be strictly arc-shaped, but instead an approximation of an arc is possible, for example using straight sections placed side by side.

In their front areas, walls 13 have these openings 135, through which end sections 165 of elastic tongues 16 and 17 project from installation frame 1 to the outside. Elastic tongues 16 and 17 thus rest against rear edges 133 and 134 of opening 135.

Figure 2:
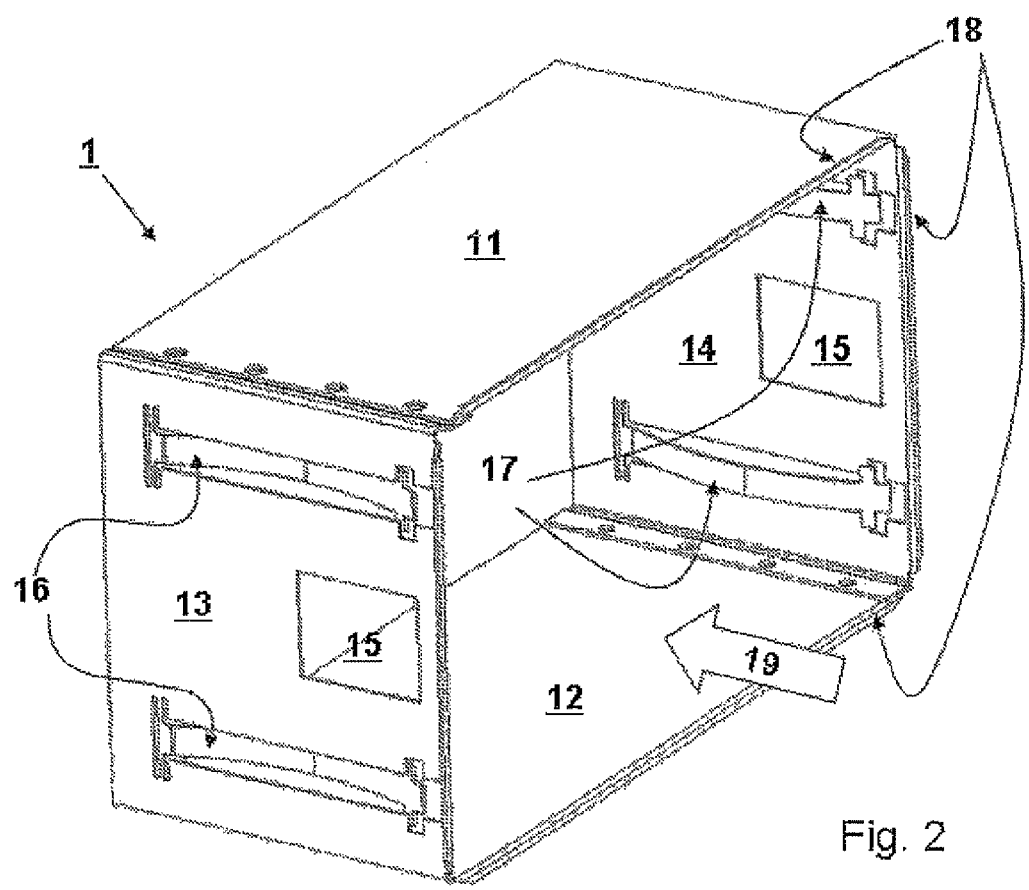
FIG. 2 shows a second variant of the installation frame according to the present invention.

Installation frame 1 according to FIG. 2 differs from the one in FIG. 1 in its dimensions and the location of elastic tongues 16 and 17. The frame in FIG. 1 is a frame for a single DIN installation shaft; the frame according to FIG. 2 is a frame for a double DIN shaft, which is higher than the frame in FIG. 1. In the first case, the elastic tongues are situated in cover 11 and in base 12; in the case of FIG. 2, they are situated in side walls 13 and 14. For the function of the present invention, it is advantageous if elastic tongues 16 and 17 are situated in walls which are opposite each other, i.e., in the cover and base or in the two side walls.

In the exemplary embodiment illustrated in the figures, elastic tongues 16, 17 are worked out. of particular walls 11, 12, 13 or 14 with the aid of shearing, the arc shape being advantageously imparted during the shearing process. The elastic property of elastic tongues 16 and 17 results from the use of a spring steel sheet for installation frame 1, so that elastic tongues 16 and 17 are also formed from spring steel.

To form the described counter bearing 133, 134 in the front area of installation shaft 1, the shearing tool is designed in such a way that tongue 16 is provided with tabs 164 in its free front area, these tabs then resting against edges 133 and 134 of opening 135. Tabs 164 are unable to slip through opening 135 as long as the elastic tongues have at least one minimum bend. Only when elastic tongues 16 and 17 are fully extended, i.e., without bending, does the length from bearing 161 to edge 133, 134 of opening 135 match the length from bearing 161 to the rear edge of tabs 164 of elastic tongue 16. However, when installation frame 1 is properly used, a full extension of the elastic tongues is not achieved. As a result, only one end section 165 of elastic tongues 16 extends through the wall (13 in this case) and out of installation frame 1.

Figure 4:
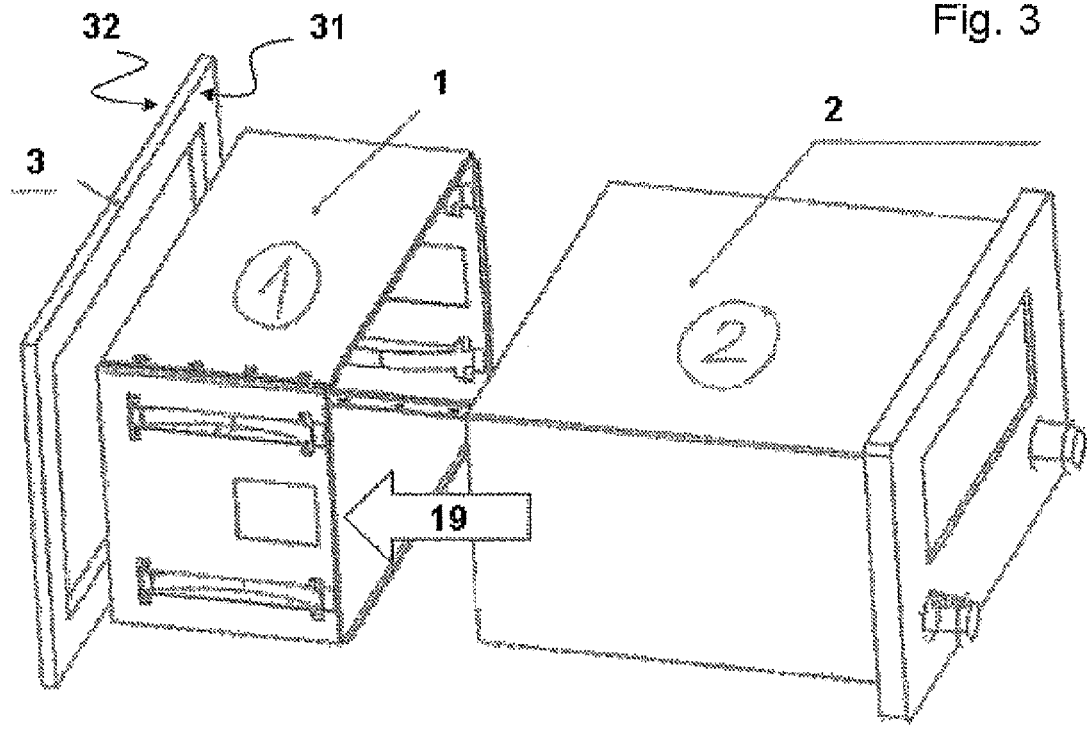
FIG. 4 shows an exploded drawing of the overall system, including the installation shaft, the installation frame and the auxiliary device to be installed.

The interaction of installation frame 1 with device 2 and installation shaft 3 is explained below, among other things on the basis of the exploded drawing of the overall system (FIG. 4).

Figure 5:
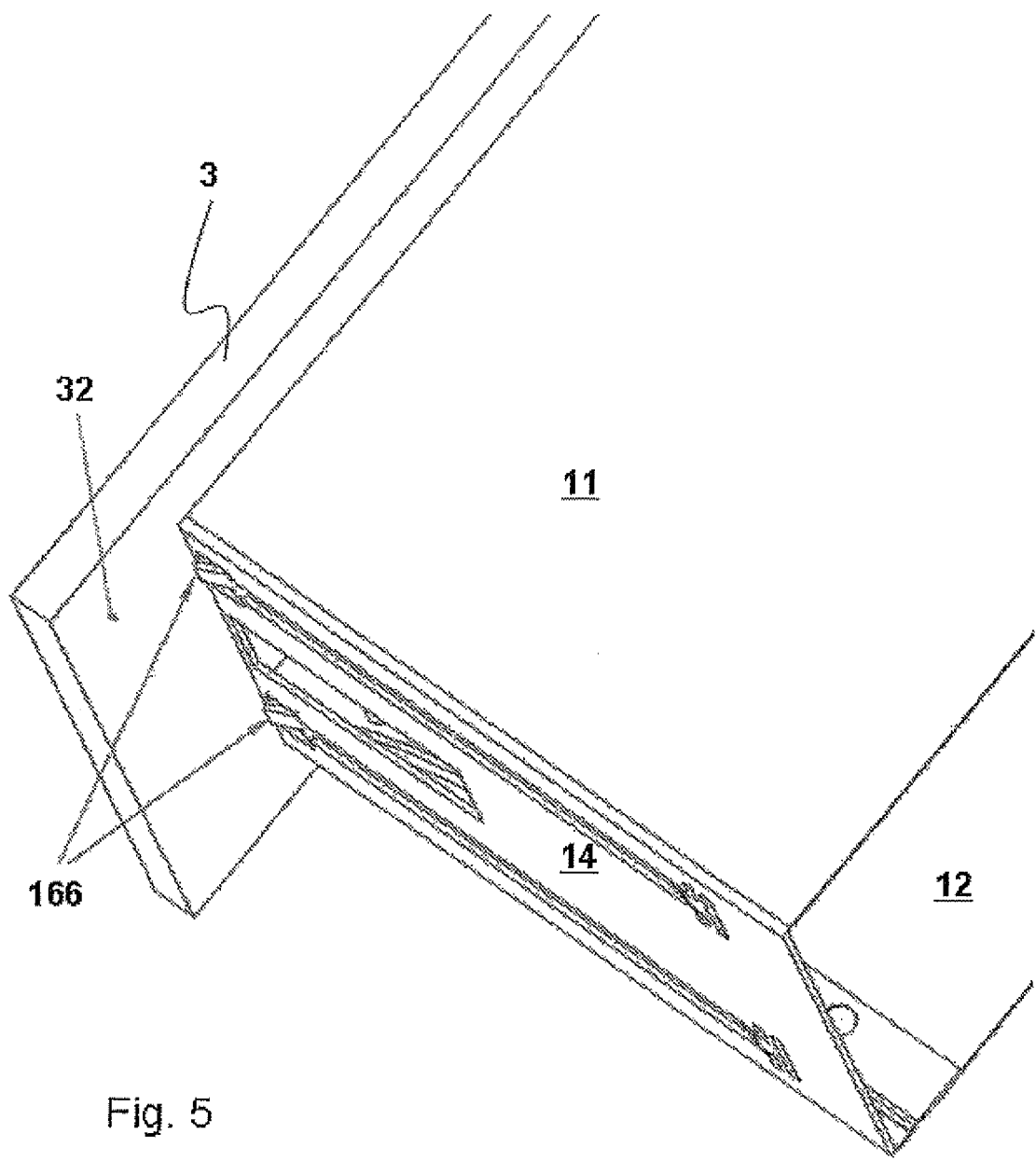
FIG. 5 shows a further detailed view of the installation frame according to the present invention, together with the installation shaft.

Installation frame 1 is initially inserted through the opening in dashboard 3 along insertion direction 19. Once end sections 165 of elastic tongues 16 and 17 have reached front edge 31 of the installation opening, these end sections draw back into the interior of frame 1 against the elastic force. Once end sections 165 of elastic tongues 16 and 17 have reached back 32 of the dashboard as the frame continues to be inserted, these end sections exit installation frame 1 through openings 135, again as a result of the elastic force. In this position, installation frame 1 is already prevented from sliding out of dashboard 3, since end sections 165, more precisely front end faces 166 of end sections 165 of elastic tongues 16, engage with dashboard 3 (see FIG. 5).

Figure 6:
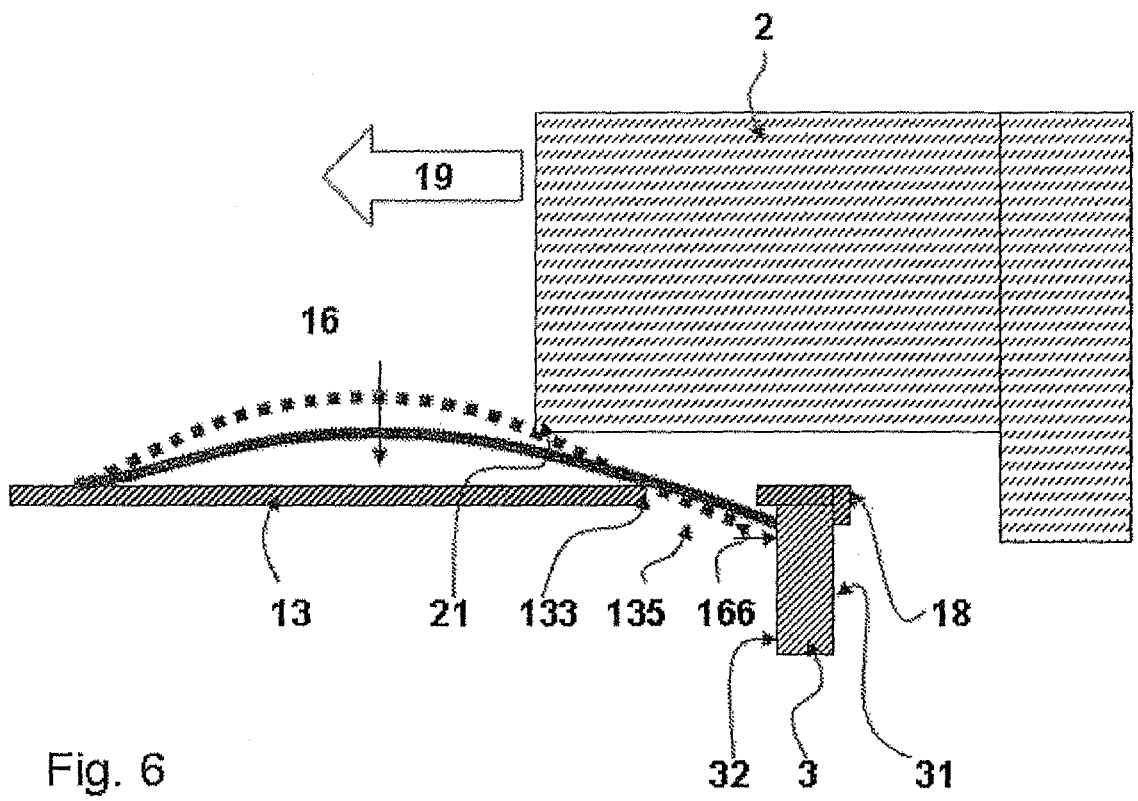
FIG. 6 shows a schematic section of the installation shaft, the installation frame and the auxiliary device to be installed for the purpose of clarifying the effectiveness of the present invention.

In the next operation, device 2, for example, a car radio or vehicle navigation device 2, is inserted into installation frame 1 along arrow direction 19 (see FIGS. 4 and 6). Starting at a certain insertion depth, one housing edge 21 of device 2 comes to rest against elastic tongue 16, which faces this edge and which extends into the interior of installation shaft 1. The same applies to an edge of the device housing which faces the opposite housing wall. The procedure is described below using only one housing side and is carried out in a manner similar to that using the opposite housing side. When device 2 is inserted farther in insertion direction 19, housing edge 21 increasingly displaces elastic tongue 16 in the direction of side wall 13 against the elastic force. Since the elastic tongue is unable to freely exit the interior of installation frame 1 through wall 13, due to the fact that tabs 164 rest against edges 133 and 134, the radius of arc 163 of elastic tongue 16 increases in size. Consequently, the imaginary chord of the arc lengthens, so that free end 165 of the elastic tongues increasingly passes to the outside through opening 135 in wall 13 provided for this purpose. In the present case, a spring excursion in which the arc is flattened by 1 mm in the direction of housing wall 13 corresponds to an elongation of the chord by 0.2 mm. If the total spring excursion is 4 mm, for example, a 0.8 mm clamping stroke of free end 165 of the elastic tongues results. Consequently, end face 166 of free end 165 of elastic tongue 16 is pressed against back 32 of dashboard 3. This produces a form-locked and force-fit connection between installation frame 1 and dashboard 3, which is clamped between edge section 18 of installation frame 1 and end face 166 of elastic tongue(s) 16, 17.

Since dashboard 3, or the edge surrounding the installation opening, is frequently made of plastic, the elastic ratios must be designed in such a way that the pressure on the dashboard is not excessive and end 166 of elastic tongue 16 does not dig too deep into the material.

In a preferred embodiment of the present invention, a cutaway section of bearing point 161 in the frame wall is used as an additional means for absorbing the clamping force applied by elastic tongue 16. This cutaway section is achieved by two slots 132 and 133 in front of and behind bearing point 161 in relation to the insertion direction. Slots 132 and 133 cause bearing strip 161 to become a spring and thus to absorb part of the clamping force which is applied to dashboard 3 by elastic tongue 16. This measure is used to protect against overloading.

The great advantage of the present invention is that the system is extremely variable as long as the basic concept of radian measure and chord, as well as the spring arm having a counter bearing, is observed. It may be used for any installation shaft size, whether this be a single DIN, double DIN or any intermediate size.

The present invention requires approximately the same dashboard thicknesses. Slight deviations in the material thickness of the installation wall are compensated by elastic tongues 16 themselves or by elastic bearing strip 161. Substantial deviations may preferably be achieved by adjusting the length of free elastic tongue end 165, by changing the prebending of the elastic tongues or by adjusting the lengths of the elastic tongues.

What is claimed is:

1. An installation frame for accommodating a device in a predefined installation opening, comprising:
    wall sections which enclose a largely cuboid cavity which is open at least on a front for accommodating the device, front edges of at least a portion of the wall sections forming flange-like outwardly projecting edge sections for resting against a front edge of the installation opening; and
    a latching arrangement which projects to an outside from at least a portion of the wall sections and engages with a back of the installation opening, the latching arrangement having at least approximately arc-shaped sections which extend into the cavity and which have an end section which projects to the outside through the wall sections for engaging with the installation opening from behind in such a way that the arc-shaped sections are flattened when a device is inserted into the cavity and are elongated in a direction of the back of the installation opening so that the installation opening is clamped between the front edge sections and the latching arrangement of the installation frame.

2. The installation frame as recited in claim 1, wherein the latching arrangement includes elastic tongues supported in an area of a wall opening.

3. The installation frame as recited in claim 2, wherein tabs, which rest against corresponding edges of the wall opening in the wall sections, are molded onto the elastic tongues for supporting the elastic tongues in the area of the wall opening.

4. The installation frame as recited in claim 2, wherein the elastic tongues are supported on an elastic strip on their ends facing away from a free end.

5. The installation frame as recited in claim 4, wherein the elastic strip is formed by cutting a bearing point out of a wall of the installation frame.

6. The installation frame as recited in claim 1, wherein the installation frame is manufactured from a spring steel sheet.

7. The installation frame as recited in claim 1, wherein the radius of the arc-shaped sections increases in size as the device is inserted into the cavity.

8. The installation frame as recited in claim 2, wherein the elastic tongues are deformed into one of a crescent shape and an arc shape, and the elastic tongues are connected to a bearing point via a bending edge.

9. An installation frame for accommodating a device in a predefined installation opening, comprising:
    wall sections which enclose a largely cuboid cavity which is open at least on a front for accommodating the device; and
    at least two elastic tongues, with a first one of the elastic tongues engaged with two installation opening on a first wall section, and with a second one of the elastic tongues engaged with two installation openings on a wall section opposite of the first wall section,
    wherein front edges of at least a portion of the wall sections form flange-like outwardly projecting edge sections for resting against a front edge of the installation openings,
    wherein each of the at least two elastic tongues is arc-shaped and extends into the cavity, and
    wherein the arc shaped sections, when a device is inserted into the cavity, are: (i) flattened and (ii) elongated in a direction through the installation openings away from the cavity.

10. The installation frame as recited in claim 9, wherein the arc-shaped area is limited to a subarea of the elastic tongues.

11. The installation frame as recited in claim 9, wherein at least one of the wall sections has at least one opening used to attach the installation frame to the device.

12. The installation frame as recited in claim 9, wherein the elastic tongues are formed from spring steel.

13. The installation frame as recited in claim 9, wherein the elastic tongues are deformed into one of a crescent shape and an arc shape, and the elastic tongues are connected to a bearing point via a bending edge.

* * * * *